United States Patent
Garg et al.

(10) Patent No.: US 9,916,404 B2
(45) Date of Patent: Mar. 13, 2018

(54) DYNAMIC BRIDGING OF INTERFACE PROTOCOLS

(71) Applicant: Synopsys, Inc., Mountain View, CA (US)

(72) Inventors: Amit Garg, Haryana (IN); Soniya Gupta, New Delhi (IN)

(73) Assignee: Synopsys, Inc., Mountain View, CA (US)

( * ) Notice: Subject to any disclaimer, the term of this patent is extended or adjusted under 35 U.S.C. 154(b) by 992 days.

(21) Appl. No.: 13/912,097

(22) Filed: Jun. 6, 2013

(65) Prior Publication Data
US 2013/0332140 A1 Dec. 12, 2013

Related U.S. Application Data

(60) Provisional application No. 61/658,322, filed on Jun. 11, 2012, provisional application No. 61/789,688, filed on Mar. 15, 2013.

(51) Int. Cl.
*G06F 9/44* (2006.01)
*G06F 17/50* (2006.01)

(52) U.S. Cl.
CPC ...... *G06F 17/5022* (2013.01); *G06F 17/5009* (2013.01)

(58) Field of Classification Search
None
See application file for complete search history.

(56) References Cited

U.S. PATENT DOCUMENTS

| 7,512,732 B1 | 3/2009 | Goossens |
| 8,693,466 B2* | 4/2014 | Johnson ............ H04M 3/42246 370/352 |
| 2003/0061385 A1* | 3/2003 | Gonze .................... H04L 69/08 709/246 |
| 2006/0282233 A1 | 12/2006 | Pasricha et al. |
| 2007/0171898 A1* | 7/2007 | Salva ................ H04L 29/06027 370/356 |
| 2012/0017197 A1 | 1/2012 | Mehta |

OTHER PUBLICATIONS

Alexander, D. Scott, et al. "Active bridging." ACM SIGCOMM Computer Communication Review. vol. 27. No. 4. ACM, 1997.*

(Continued)

*Primary Examiner* — Omar F Fernandez Rivas
*Assistant Examiner* — Nithya J. Moll
(74) *Attorney, Agent, or Firm* — Fenwick & West LLP

(57) ABSTRACT

Systems and methods for protocol bridging for a system level modeling simulation (SLMS), such as a SYSTEMC simulation where the components communicate using a TLM2.0 application programming interface (API). The method includes accessing design configuration information describing a first component of the SLMS that uses a first communication protocol and a second component of the SLMS that uses a second communication protocol. Run-time bridging logic is inserted between the first component and the second component based on the design configuration information. The run-time bridging logic is inserted at initialization of the SLMS and configured to bridge the first communication protocol of the first component and the second communication protocol of the second component.

23 Claims, 8 Drawing Sheets

(56) References Cited

OTHER PUBLICATIONS

Panda, Preeti Ranjan. "SystemC—a modeling platform supporting multiple design abstractions." System Synthesis, 2001. Proceedings. The 14th International Symposium on. IEEE, 2001.*

Shin, Dongwan, et al. "Automatic generation of transaction level models for rapid design space exploration." Proceedings of the 4th international conference on Hardware/software codesign and system synthesis. ACM, 2006.*

Klingauf, W. et al., "Embedded Software Development on Top of Transaction-Level Models," 2007 $5^{th}$ IEEE/ACM/FIP International Conference on Hardware/Software Codesign and System Synthesis (CODES+ISSS), IEEE, 2007, pp. 27-32.

Kogel, T. et al., "A Modular Simulation Framework for Architectural Exploration of On-Chip Interconnection Networks," Proceedings of the $1^{st}$ IEEE/ACM/FIP International Conference on Hardware/Software Codesign and System Synthesis, ACM, 2003, 6 pages.

"Requirements Specification for TLM 2.0" Version 1.1, Sep. 16, 2007, 32 pages.

"OSCI TLM-2.0 Language Reference Manual," Software Version: TLM 2.0.1, Document Version: JA32, Open SystemC Initiative (OSCI), Jul. 2009, 194 pages.

* cited by examiner

500

Simulation Initialization:
- Access design configuration information
  552
- Identify desired protocol specifications based on protocols specified in design configuration information
  554
- Generate RTB logic based on desired protocol specifications
  556
- Insert RTB logic for components specified by design configuration information
  558

Simulation Run-time:
- Intercept and translate communication payloads using RTB logic
  560

FIG. 5

DYNAMIC BRIDGING OF INTERFACE PROTOCOLS

CROSS REFERENCE TO RELATED U.S. APPLICATIONS

This application claims benefit of and priority to U.S. provisional patent application 61/658,322, entitled "DYNAMIC BRIDGING OF IEEE 1666 TLM 2.0 BASED INTERFACE PROTOCOLS" and filed on Jun. 11, 2012, the contents of which are incorporated by reference herein in its entirety.

This application also claims benefit of and priority to U.S. provisional patent application 61/789,688, entitled "SYSTEM AND METHOD FOR DYNAMIC BRIDGING OF INTERFACE PROTOCOLS" and filed on Mar. 15, 2013, the contents of which are incorporated by reference herein in its entirety

FIELD OF THE DISCLOSURE

Embodiments of the present disclosure are generally related to simulated systems.

BACKGROUND

As computer systems have advanced, processing power and speed have increased substantially. At the same time, computer system complexity and the number of components included in a computer system have increased significantly. System design has correspondingly increased in complexity as more and more increasingly complex components are used in a given computer system.

In order to accelerate the development process, computer systems and the corresponding components are simulated. A computer system may have several buses that allow the various components of the computer system to communicate. Unfortunately, many component simulations have been designed around different protocols and are not able to natively communicate with each other.

Conventional solutions have involved creation of dedicated conversion components to handle conversion of communications between the numerous protocols of the components. These conversion components need to be created for each protocol pair resulting in complex conversions and a large validation space to ensure protocol compliance at both ends. For example, for n communication protocols a total of $2*(n*(n-1)$ conversion components need to be developed and verified. The use of a large number of conversion components often negatively impacts the efficiency of the simulation. Often such components are custom and hard coded involving significant development time and reducing flexibility thereby necessitating significant reworking for interface changes.

Thus, a need exists for a solution to allow conversion of communication protocols without dedicated fixed logic conversion components.

SUMMARY

Embodiments of the present disclosure overcome the need for creating dedicated logic and insertion of the dedicated logic in a design for bridging different communication protocols for on and off-chip communications components. An efficient mechanism for bridging of protocols or interface protocols, semantics, and application program interfaces (APIs) within system level modeling simulations is thus provided. Embodiments of the present disclosure are operable to model an interconnect network of a simulated computer system.

In one embodiment disclosed is a method of protocol bridging for a system level modeling simulation (SLMS). The method comprises accessing design configuration information describing a first component of the SLMS that uses a first communication protocol and a second component of the SLMS that uses a second communication protocol. Run-time bridging logic is inserted between the first component and the second component based on the design configuration information. The run-time bridging logic inserted at initialization of the SLMS and configured to bridge the first communication protocol of the first component and the second communication protocol of the second component. In one embodiment, the SLMS is a SYSTEMC simulation where the components communicate using a Transaction Level Modeling 2.0 (TLM2.0) compliant API.

In one embodiment, disclosed is a non-transitory computer readable medium storing processor executable instructions for protocol bridging for a system level modeling simulation (SLMS). The instructions comprise instructions for accessing design configuration information describing a first component of the SLMS that uses a first communication protocol and a second component of the SLMS that uses a second communication protocol. Run-time bridging logic is inserted between the first component and the second component based on the design configuration information. The run-time bridging logic inserted at initialization of the SLMS and configured to bridge the first communication protocol of the first component and the second communication protocol of the second component.

BRIEF DESCRIPTION OF THE DRAWINGS

Embodiments of the present disclosure are illustrated by way of example, and not by way of limitation, in the figures of the accompanying drawings and in which like reference numerals refer to similar elements.

FIG. 5 is a flowchart of a process for run-time protocol translation, according to an embodiment.

DETAILED DESCRIPTION

Figure 1:
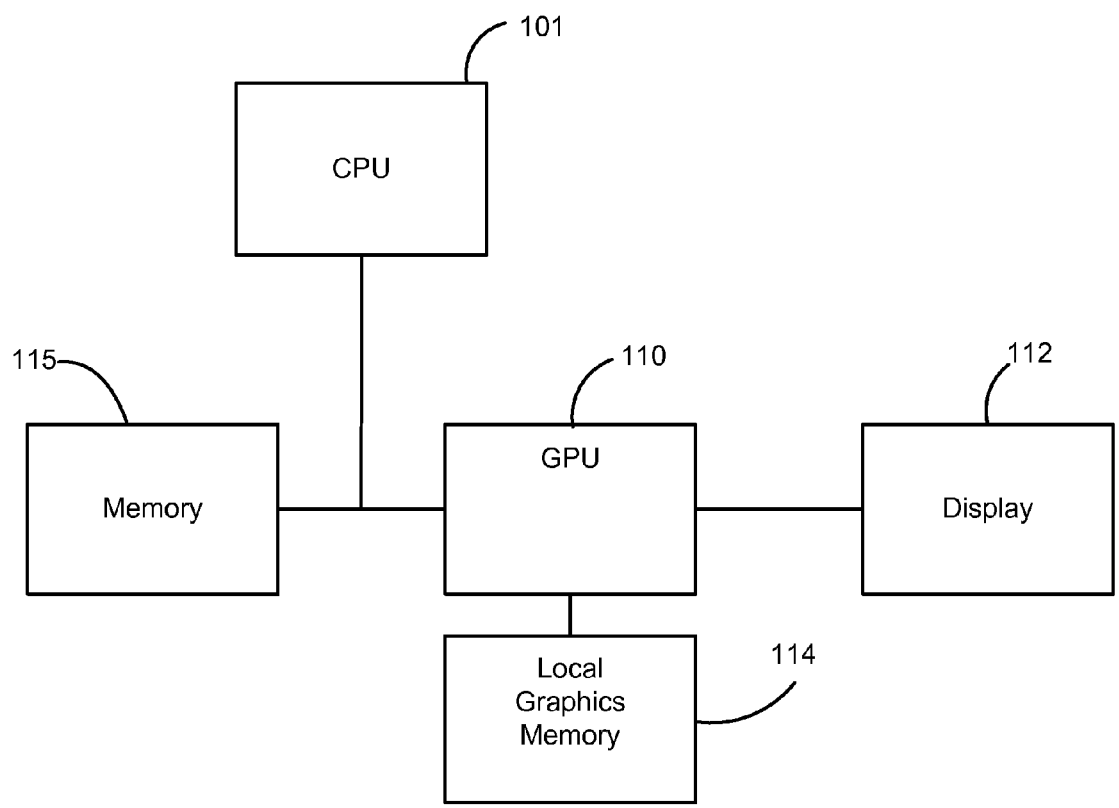
FIG. 1 shows a computer system in accordance with one embodiment of the present disclosure.

Reference will now be made in detail to the preferred embodiments of the present disclosure, examples of which are illustrated in the accompanying drawings. While the disclosure will be described in conjunction with the preferred embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of embodiments of the present disclosure, numerous specific details are set forth in order to provide a thorough understanding of the present disclosure. However, it will be recognized by one of ordinary skill in the art that the present disclosure may be practiced without these specific details. In other instances, well-known methods, procedures, components, and circuits have not been described in detail as not to unnecessarily obscure aspects of the embodiments of the present disclosure.

Notation and Nomenclature

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "processing" or "accessing" or "executing" or "storing" or "rendering" or the like, refer to the action and processes of an integrated circuit (e.g., computing system 100 of FIG. 1), or similar electronic computing device, that manipulates and transforms data represented as physical (electronic) quantities within the computer system's registers and memories into other data similarly represented as physical quantities within the computer system memories or registers or other such information storage, transmission or display devices.

Exemplary Computer System Environment

FIG. 1 shows an exemplary computer system 100 in accordance with one embodiment of the present disclosure. FIG. 1 depicts an embodiment of a computer system operable to execute embodiments of the present disclosure and a computer system operable to be simulated in conjunction with embodiments of the present disclosure, as described herein. Computer system 100 depicts the components of a generic computer system in accordance with embodiments of the present disclosure providing the execution platform for certain hardware-based and software-based functionality. In general, computer system 100 comprises at least one CPU 101, a system memory 115, and at least one graphics processing unit (GPU) 110. The CPU 101 can be coupled to the system memory 115 via a bridge component/memory controller (not shown) or can be directly coupled to the system memory 115 via a memory controller (not shown) internal to the CPU 101. The GPU 110 may be coupled to a display 112. One or more additional GPUs can optionally be coupled to system 100 to further increase its computational power. The GPU(s) 110 is coupled to the CPU 101 and the system memory 115. The GPU 110 can be implemented as a discrete component, a discrete graphics card designed to couple to the computer system 100 via a connector (e.g., AGP slot, PCI-Express slot, etc.), a discrete integrated circuit die (e.g., mounted directly on a motherboard), or as an integrated GPU included within the integrated circuit die of a computer system chipset component (not shown). Additionally, a local graphics memory 114 can be included for the GPU 110 for high bandwidth graphics data storage.

The CPU 101 and the GPU 110 can also be integrated into a single integrated circuit die and the CPU and GPU may share various resources, such as instruction logic, buffers, functional units and so on, or separate resources may be provided for graphics and general-purpose operations. The GPU may further be integrated into a core logic component. Accordingly, any or all the circuits and/or functionality described herein as being associated with the GPU 110 can also be implemented in, and performed by, a suitably equipped CPU 101. Additionally, while embodiments herein may make reference to a GPU, it should be noted that the described circuits and/or functionality can also be implemented and other types of processors (e.g., general purpose or other special-purpose coprocessors) or within a CPU.

System 100 can be implemented as, for example, a desktop computer system or server computer system having a powerful general-purpose CPU 101 coupled to a dedicated graphics rendering GPU 110. In such an embodiment, components can be included that add peripheral buses, specialized audio/video components, IO devices, and the like. Similarly, system 100 can be implemented as a handheld device (e.g., cellphone, smartphone, etc.), direct broadcast satellite (DBS)/terrestrial set-top box or a set-top video game console device such as, for example, the Xbox®, available from Microsoft Corporation of Redmond, Wash., or the PlayStation3®, available from Sony Computer Entertainment Corporation of Tokyo, Japan. System 100 can also be implemented as a "system on a chip (SoC)", where the electronics (e.g., the components 101, 115, 110, 114, and the like) of a computing device are wholly contained within a single integrated circuit die. Examples include a hand-held instrument with a display, a car navigation system, a portable entertainment system, and the like.

Exemplary Systems and Methods

Embodiments of the present disclosure overcome the need for creating dedicated logic and insertion of the dedicated logic in a design for bridging different communication protocols for on and off-chip communications components. An efficient mechanism for bridging of protocols or interface protocols, semantics, and APIs within SYSTEMC simulations is thus provided. Embodiments of the present disclosure are operable to model an interconnect network of a simulated computer system.

Embodiments of the present disclosure provide a framework in which bridging logic is dynamically inserted at various interface points based on a design configuration. Due to the run time nature, embodiments of the present disclosure allow for on-the-fly or dynamic re-configurability of the design. In one embodiment, the framework is based on SYSTEMC transaction level modeling (e.g., IEEE 1666 TLM2.0) semantics and operable with communicating entities using TLM2.0 semantics while adhering to detailed protocol specifications.

Embodiments of the present disclosure thereby eliminate the need for creation and verification of dedicated logic blocks for bridging of various protocols. Embodiments of the present disclosure thus eliminate the need for inserting and wiring up additional components that perform logic conversion at design creation time. Embodiments of the present disclosure further significantly ease the design creation of a heterogeneous SoC and reduce model availability problems relating to various protocol bridging models.

Dynamic generation of the dynamic bridging logic may include looking up mappings in a central registry for adding/morphing or deleting interface method calls and state transitions across two communicating entities mimicking the peer part of the protocol handling of the protocol. Embodiments of the present disclosure also perform mapping of attributes on demand when requested by a destination component to reduce simulation time.

Figure 2:
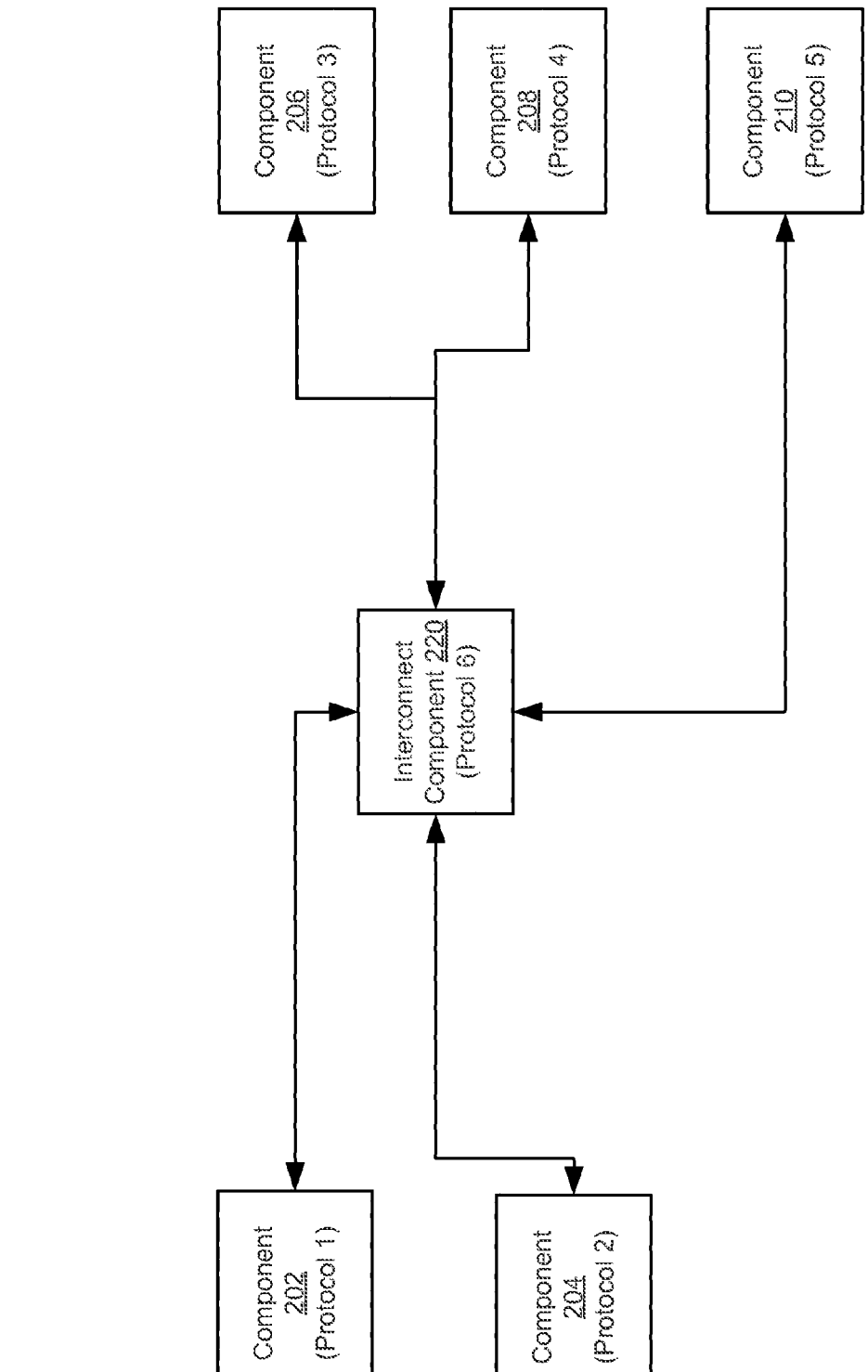
FIG. 2 shows an exemplary simulated component coupling in a simulated computer system in accordance with one embodiment of the present disclosure.

FIG. 2 shows a component coupling in a simulated computer system 200 in accordance with one embodiment of the present disclosure. Exemplary simulated computer system 200 includes components 202-210 and interconnect component 220. In one embodiment, a component refers to the simulation representation of a real synthesizable hardware block that provides the specified logical functionality in a computer system. In one embodiment, the simulated computer system 200 can represent the computer system 100 from FIG. 1. The simulation of the simulated computer system 200 can be carried out on a host system, which can also resemble the computer system 100 from FIG. 1.

Components 202-210 may be any of a variety of computer or system on a chip (SoC) components including, but not limited to, an Ethernet interface, a wireless network interface, an audio controller, a memory controller, a storage controller, a modem controller, a display controller, a graphics processing unit, a central processing unit, a coprocessor, a digital signal processor, an analog signal processor, a USB controller, a IEEE 1394 controller, available from Apple Corporation of Cupertino, Calif., a Thunderbolt™ controller, available from Intel Corporation of Santa Clara, Calif., etc. Interconnection component 220 may be a simulated interconnect or bus of a simulated computer system. In one embodiment, an interconnect is a central component that acts as a communication backbone of a computer system which enables routing of information amongst different components in the system.

In one embodiment, components are simulated with SYSTEMC. SYSTEMC is a system-level modeling language that is approved by the Institute of Electrical and Electronics Engineers (IEEE) Standards Association as IEEE 1666. SYSTEMC allows describing a system at different levels of abstraction. More specifically, SYSTEMC is a language built in standard C++ by extending the language with the use of class libraries. SYSTEMC addresses the need for a system design and verification language that spans hardware and software. The language is particularly suited for modeling a system's partitioning, for evaluating and verifying the assignment of blocks to either hardware or software implementations, and for architecting and measuring the interactions between and among functional blocks. Throughout the specification, SYSTEMC will be used as an example of a system-level modeling language, but the principles described herein are applicable to any system-level modeling language.

The applications programming interface (API) (e.g., IEEE 1666 TLM2.0) for modeling with SYSTEMC at the transaction level has been standardized and is referred to as TLM2.0 (Transaction Level Modeling 2.0). TLM2.0 APIs of SYSTEMC provide a generic approach to defining communication protocols or the models for the actual protocols. The API can thus be used to setup a protocol for components to communicate. However models of components may come from different places, be designed for different protocols, or different abstractions of the same protocol in more or less detail.

Components 202-210 may each be designed or configured for communication by communication protocols 1-5, respectively. Interconnect component 220 is configured to communicate by communication protocol 6. In one embodiment, a communication protocol establishes rules (e.g. as a state machine) for the information interchange semantics, the format, and context of the information exchanged between two components in order to achieve system level behavior. Examples of communication protocols include the Advanced High Performance Bus (AHB) and the Advanced Extensible Interface (AXI). Components communicate with each other during a simulation by invoking interface method calls of a TLM 2.0 send API (which can be part of the components) and using the API to transmit a communication payload that is formatted according to an appropriate communication protocol.

In one embodiment, a communication payload includes payload attributes and protocol state attributes. Payload attributes are elements carrying information in the payload. There are generally two types of payload attributes: generic attributes and protocol specific attributes. Generic attributes are protocol agnostic and used by many protocols. Examples of generic attributes are data and address attributes. Protocol specific attributes are specific to a particular protocol. Examples of protocol specific attributes are a burstSize attribute specifying the size of each data beat or a burstLen attribute specifying the number of data beats in a given transaction. It is noted that often a protocol specific attribute for one protocol may correspond to a protocol specific attribute in a different protocol and should be interpreted correctly for correct functionality.

Protocol state attributes indicate different protocol phases that are needed in order to complete a transaction. Protocol communications are typically performed in different logical phases. Examples of protocol phases include an address phase, a data exchange phase, and a completion phase. Different protocols may use different protocol phases. In other words, different protocols may have different required states and transactions according to protocol semantics. In one embodiment protocol states attributes may be considered a type of protocol specific state attribute.

In one embodiment, a formal specification of a protocol definition may comprise: 1) specification of any protocol specific payload attributes (e.g., if needed) and 2) specification of a protocol state attribute. The specification of the protocol state attribute comprises possible state values and allowed state transitions.

Embodiments of the present disclosure facilitate communication between two components (e.g. component 202 and interconnect component 220, or any other components) operating with different protocols. The components may have different semantics and protocols. Embodiments of the present disclosure are further operable to modify communications between two components operating with different communication protocols. In other words, each component may have been originally designed with different protocols or semantics and the different communication protocols need to be bridged to allow communication between the components.

Embodiments of the present disclosure are operable for dynamic generation of run-time bridging logic based on formal protocol specification and run time translation. Embodiments further provide run-time interception and translation of communication calls and mapping between payloads and protocol states of different protocols. Run time interception may refer to the capture of information when the system (e.g., simulated computer system) is working such that the captured information can be inspected and if needed transformed before reaching the destination. Embodiments of the present disclosure are further operable to support bridging or translation of communications where a component changes the protocol being used during run time. Processes and components shown in FIG. 3-7 may be used to translate communications between different protocols, as described herein.

Figure 3:
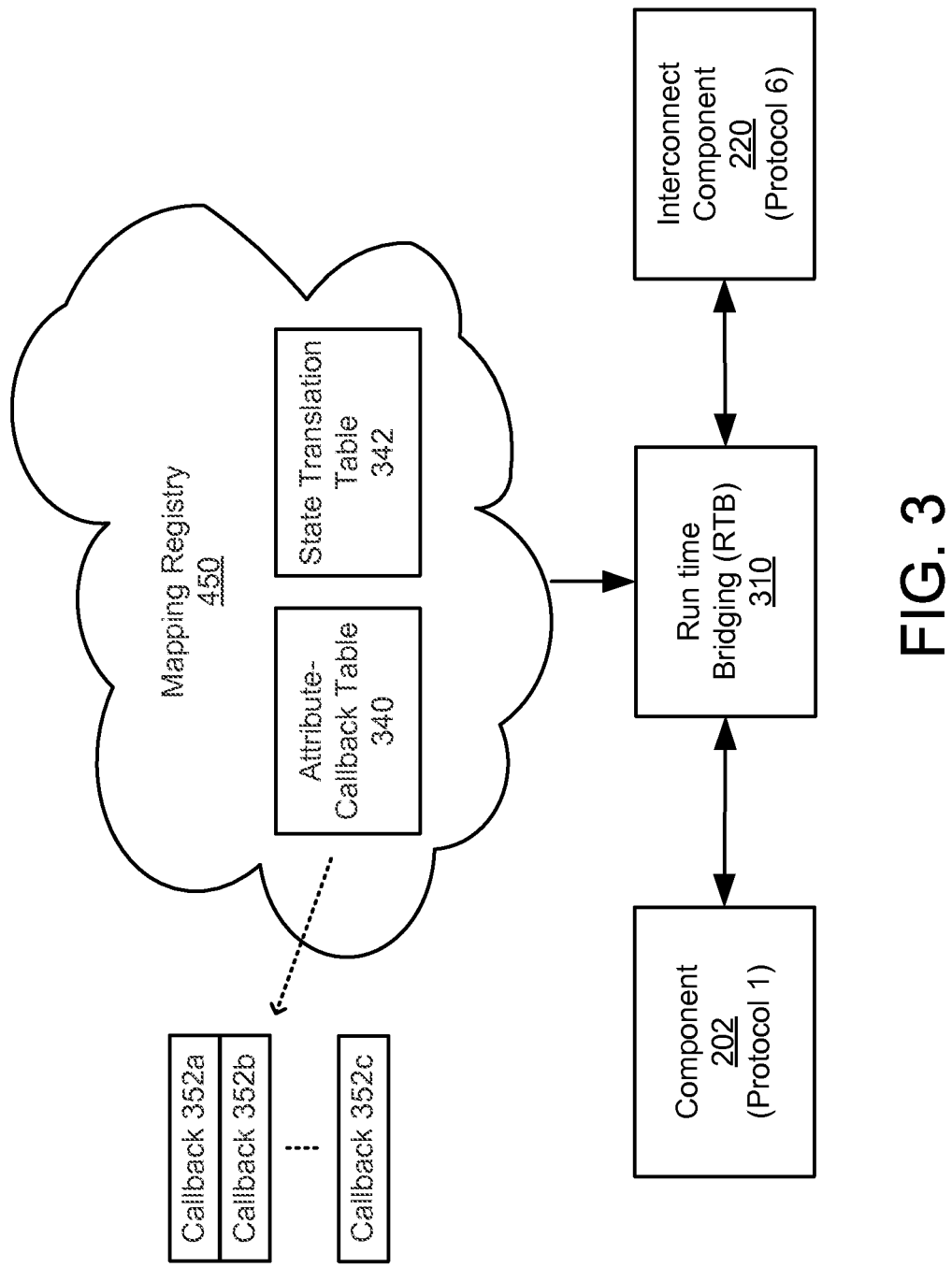
FIG. 3 shows a block diagram of an exemplary component communication in accordance with one embodiment of the present disclosure.

FIG. 3 shows a block diagram of component communication in accordance with one embodiment of the present disclosure. Diagram 300 includes component 202 and interconnect component 220, a run-time bridging (RTB) logic 310 inserted between component 202 and interconnect component 220, a mapping registry 450 accessed by the RTB logic 310, and attribute mapping callbacks 352. FIG. 3 depicts exemplary conceptual communication of two simulated components and interception of communications between the simulated components. In other embodiments, the RTB logic 310 may be inserted between any of the components shown in FIG. 2.

Mapping registry 450 can be a database that stores information about the attributes of the various protocols and information about mapping payloads from one protocol (e.g., protocol 1) to a different protocol (e.g., protocol 6). It may also include logic to determine what attribute mapping callbacks 352 should be invoked based on attributes requested at run-time. As shown, mapping registry 450 includes an attribute-callback mapping table 340 and a protocol state translation table 342.

Attribute-callback mapping table 340 includes a list of protocol specific attributes and references to attribute mapping callbacks 352 that are registered for those attributes. An attribute mapping callback 352 is logic that maps attribute information from a communication payload into a protocol specific attribute for a destination protocol (e.g., protocol 6). Each attribute mapping callback 352 can be used for mapping into a different protocol specific attribute. For example, callback 352a can be used for mapping into a protocol specific attribute for protocol 1, callback 352b can be used for mapping into a protocol specific attribute for protocol 2, etc.

An attribute mapping callback 352 can expect a specific set of inputs and returns a specific set of outputs in a specified format. For example, attribute mapping callback 352 can receive all the payload attributes of a communication payload and process those attributes to return a protocol specific attribute for a destination protocol (e.g., protocol 6).

In one embodiment, each attribute mapping callback 352 performs a formal one to one attribute mapping of attributes from one protocol to attributes for another protocol, such as value mappings. The mapping is independent of the source protocol, meaning that a single attribute mapping callback 352 can be used to extract a protocol specific attribute regardless of the source protocol. For example, a single attribute mapping callback 352c can be used to extract a protocol specific attribute for protocol 6 from a payload regardless of whether the payload is formatted for protocol 1, protocol 2, protocol 3, etc.

In one embodiment, the attribute mapping callbacks 352 may be stateless and do not need information about prior communications to perform attribute translation. In one embodiment, the attribute mapping callbacks may be invoked by the RTB logic 310 on an as needed basis.

State translation table 342 includes a mapping of states between many different protocols in the form of a rule table. For example, the state translation table 342 can include a mapping of states between protocol 1 and protocol 6, between protocol 1 and protocol 2, etc. In one embodiment, each transformation in the state translation table 342 may be specified as a combination of a particular state value for the source and the destination protocol and a group of associated payload attribute(s). State mapping can be done using a combination of payload attributes and state attributes. This allows specification of a unique mapping to destination protocol state transitions. For example, a mapping of states from the TLM2.0 Generic protocol to Advanced eXtensible Interface (AXI) for a write transaction may be specified as:

PAYLOAD ATTRIBUTES={$CMD$=WRITE, PHASE=BEGIN_REQ}

$AXI$_STATES={$AW$VALID,$AW$READY,$W$VALID, $W$READY,$W$VALID LAST,$W$READY LAST}

This example shows that the attributes in a TLM 2.0 generic protocol, used as the source protocol, are CMD having a value WRITE and PHASE having a value of BEGIN_REQ. When the payload attribute CMD has the value of WRITE and the payload attribute of PHASE has the value of BEGIN_REQ, the resulting AXI state values that are mapped to are AWVALID, AWREADY, WVALID, WREADY, WVALID_LAST, WREADY_LAST. So one set of input state values maps to multiple output state values. In this example, AWVALID will be sent to the destination component, and destination will respond with AWREADY. WVALID will be sent to the destination component, and the destination will responds with WREADY. WVALID_LAST will be sent to the destination component, and the destination will respond with WREADY_LAST. WVALID will be sent multiple times depending on a length attribute in the payload (not shown).

Payload attributes & state attributes may allow for merging and splitting of states across protocols that have differing capabilities. For example, bridging a protocol having shared read and write paths to a protocol having dedicated read and write paths may necessitate state splitting. As an example, mapping between TLM2.0 generic protocol which has a single request and response path and AXI which has dedicated request and response paths for reads and writes, would need splitting of an incoming generic protocol request to either READ_REQUESTS or WRITE_REQUESTS on the AXI side.

In one embodiment, attribute-callback table 340 and state translation table 342 are populated at the time of protocol specification prior to simulation initialization or run time. Additional protocol mappings can be defined dynamically at anytime during run time and the additional protocol mappings are pluggable into the simulation framework of embodiments of the present disclosure. For example, the state translation table 342 may be centrally available to the simulation framework at run time for dynamic insertion of conversion semantics on a communication interface. The state translation tables 342 may be provided to the simulation framework in a plug and play manner such that additional translations can be added or plugged in at any time (e.g., dynamically during runtime).

Component 202 is designed to communicate based on protocol 1 and component 220 is designed to communicate based on protocol 6. For purposes of explanation, component 202 will be referred to as a source component and interconnect component 220 will be referred to as a destination component. The protocol used by the source component 202 may be referred to as a source protocol and the protocol used by the destination component 220 may be referred to as a destination protocol. However, as communications are inherently bi-directional, either component 202 and component 220 may be a source or a destination of a communication payload depending on which component is generating the communication payload.

At initialization of a SYSTEMC simulation, run time bridging block 310 is inserted between the source component 202 and destination component 220 bridge communications between the source protocol and the destination protocol. Run time bridging logic 310 can intercept communication payloads transmitted between the source component 202 and the destination component 220 and translate the communication payloads for the destination protocol. In one embodiment, RTB logic 310 is inserted between two communicating entities by modifying the implementation of the TLM 2.0 API in both components 202 and 220 such that the RTB logic 310 can intercept payloads that are transmitted between components 202 and 220.

RTB logic 310 is dynamically generated using the information in the attribute-callback table and the state translation table 342 that is appropriate for translating communications between the source/destination protocols. The RTB logic 310 is dynamically generated at initialization of a SYSTEMC simulation. The RTB bridging logic is generated with all the necessary logic needed to do state translation between the source/destination protocols and all the necessary logic needed to locate callbacks 352 for attribute translation between the source/destination protocols. Once generated, the RTB logic 310 no longer needs to access the mapping registry 450 during run-time to perform protocol translations. In one embodiment, generating the run-time bridging logic can include identifying specific portions of the state translation table 342 and attribute-callback table 340 that are appropriate for translation between the source/destination protocols and then using these portions of the tables to create a decision tree in the run time bridging logic 310.

In one embodiment, after intercepting a payload from the source component 202 that is formatted for the source protocol, the RTB logic 310 maps the state of the source protocol into a state of the destination protocol, modifies the state in the payload with the state of the destination protocol, and forwards the modified payload on to the destination component 220. However, RTB logic 310 does not provide mapped attributes to the destination component 220 until the destination component 220 requests it. In one embodiment, the destination component 220 will request an attribute from the payload. A payload in SYSTEMC can be stored as an object from which information can be requested from. Making a request to the payload implicitly invokes the RTB logic 310 and causes the RTB logic 310 to process the request. For example, when destination component 302 requests a certain attribute from the payload which is not present but another corresponding attribute which has a mapping defined to the requested attribute is present then RTB logic 310 performs mapping of the attribute and the data is returned to the destination component 310 as if it were present in the payload natively. Performing translation on-demand reduces the amount of time required to process each payload. In other embodiments, the RTB logic 310 may provide translated attributes to the destination component 220 with every intercepted payload.

Once the mapped states and attributes are provided to the destination component 220, the destination component 220 is free to morph/update the attribute as per the protocol semantics. On completion of the processing the destination component 220 updates the payload and returns the payload to the source component 202. On the reverse intercept path, the RTB logic 310 re-translates the state and attributes for the source protocol of the source component 202.

Figure 4:
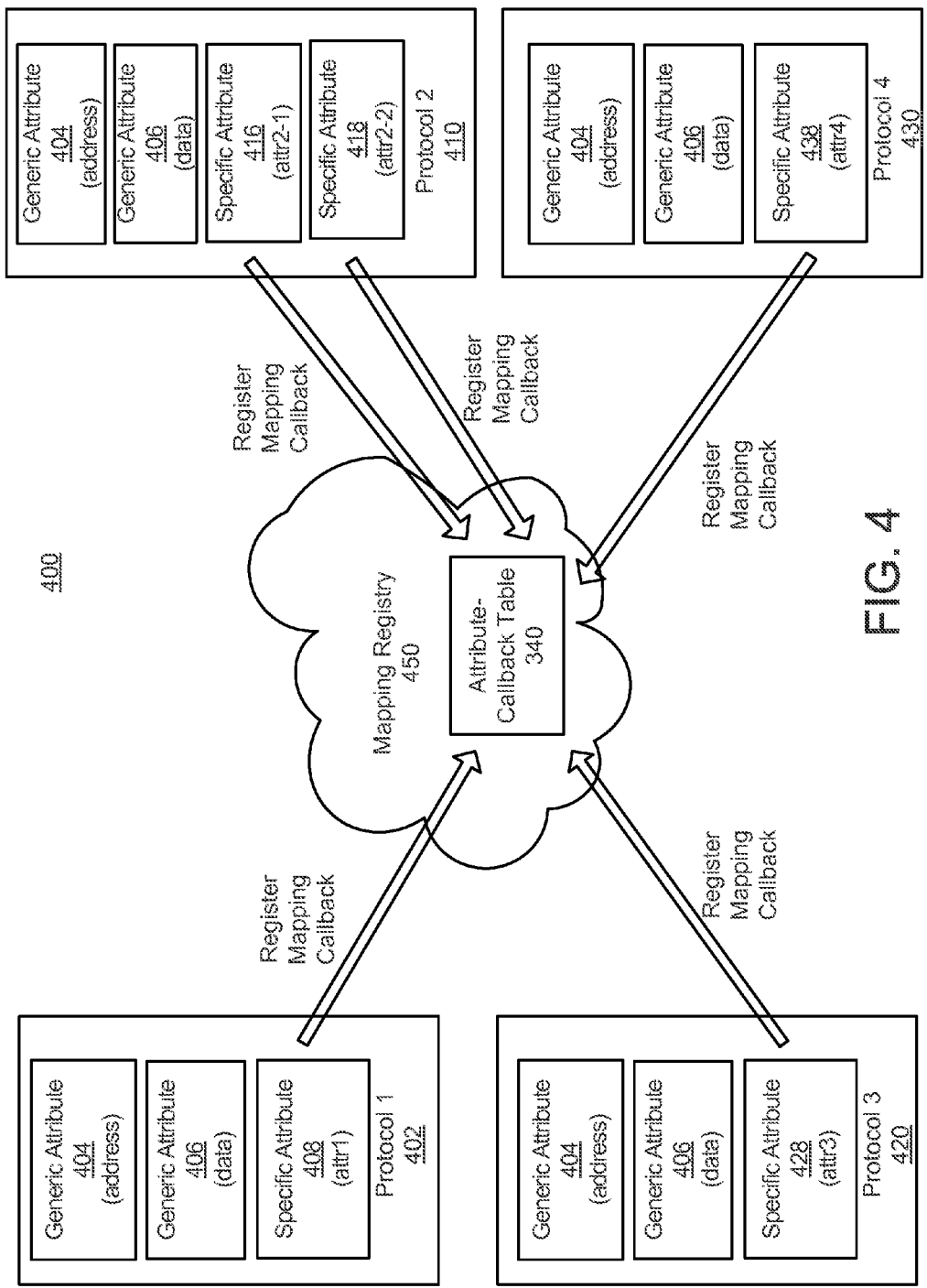
FIG. 4 shows protocol specifications and registration of callbacks to create the mapping registry, in accordance with an embodiment of the present disclosure.

FIG. 4 shows protocol specifications and registration of callbacks to create the mapping registry 450, in accordance with an embodiment of the present disclosure. The registration of callbacks typically occurs prior to initialization of a simulation. In other embodiments, the registration can occur during simulation run-time.

As shown, there are four different protocol specifications 402, 410, 420 and 430 for four different protocols. As previously described, protocols can communicate information with generic attributes and protocol specific attributes. Generic attributes are attributes common to all protocols and are used in any computer system (e.g., address and data). Protocol specific attributes may be attributes specific to a protocol. In more detail, protocol specification 402 for protocol 1 includes generic attributes 404 (address) and 406 (data) and protocol specific attribute 408 (attr1). Protocol specification 410 for protocol 2 includes generic attribute 404 (address) and 406 (data) and protocol specific attributes 416 (attr2-1) and 418 (attr2-2). Protocol 420 includes generic attributes 404 (address) and 406 (data) and protocol specific attribute 428 (attr3). Protocol 430 includes generic attributes 404 (address) and 406 (data) and protocol specific attribute 438 (attr4).

Each protocol specific attribute and its associated mapping callback 352 is registered with the mapping registry 450 to create the attribute-callback table 340. This registration typically occurs prior to initialization of a simulation. The mapping callbacks 352 are written by a designer that is familiar with what type of logic is needed in order to obtain a protocol specific attribute from a payload. A different mapping callback 352 can be registered for each protocol specific attribute. Registration of the mapping callbacks 352 enables the appropriate mapping callback 352 to be identified at run-time when attribute translation is needed.

Figure 6A:
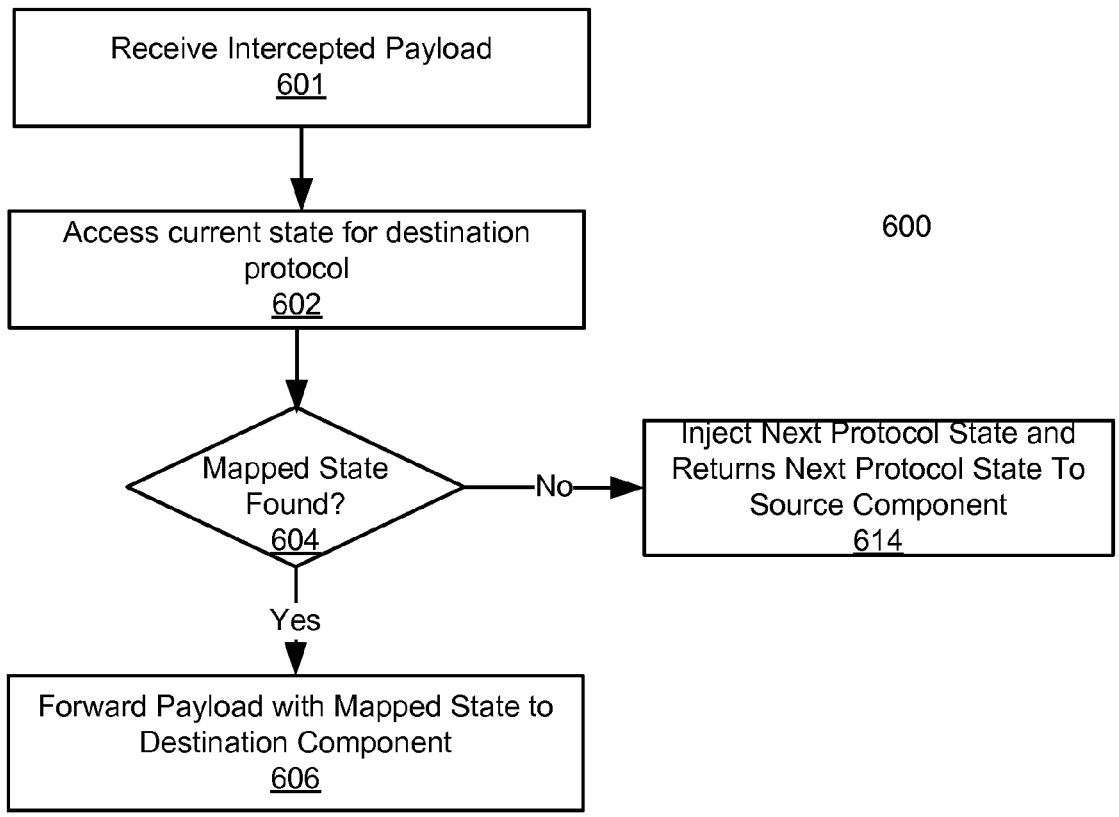
FIG. 6A shows a flowchart of a process for protocol state mapping in accordance with one embodiment of the present disclosure.
Figure 6B:
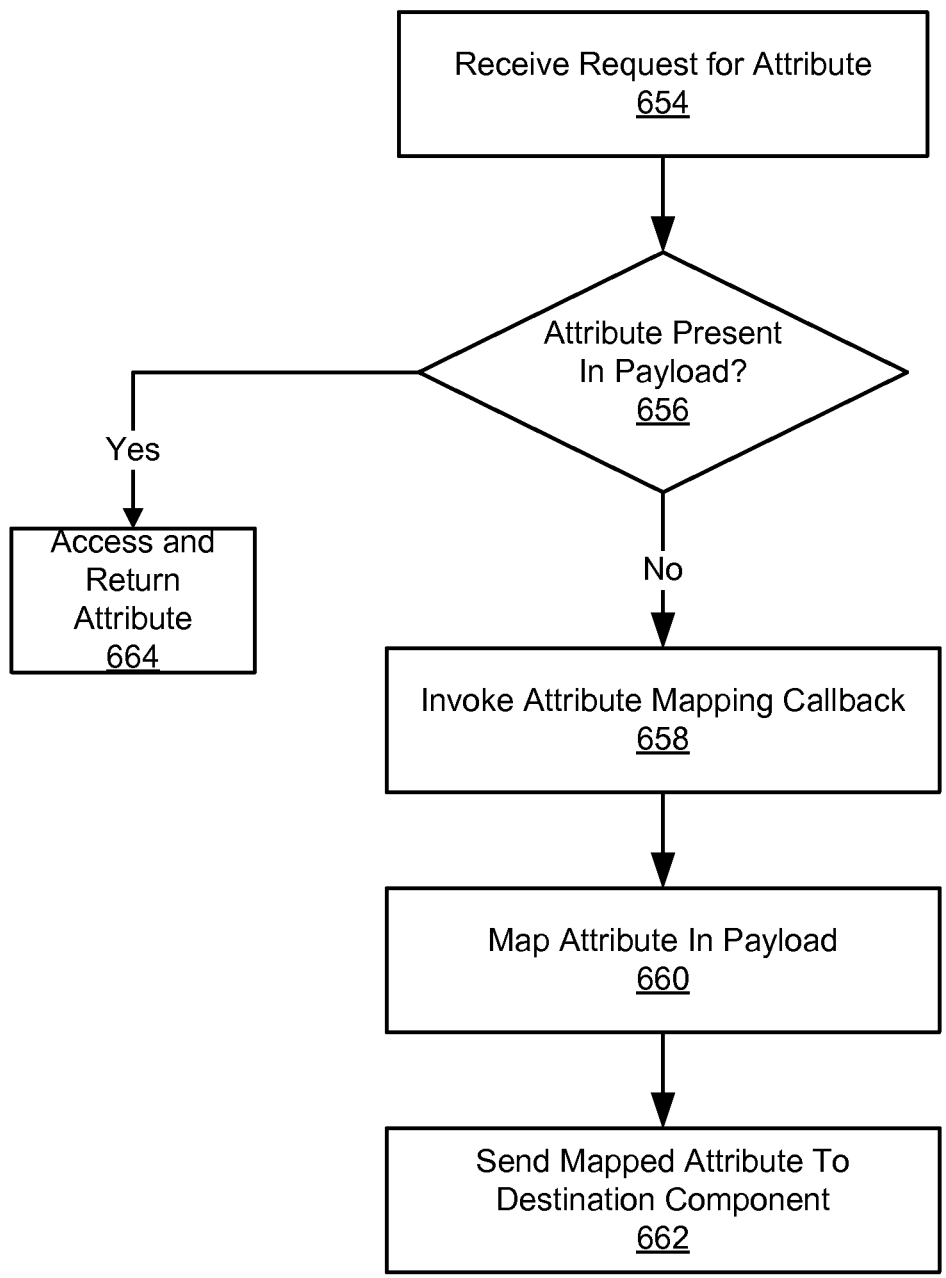
FIG. 6B shows a flowchart of a process for attribute mapping in accordance with one embodiment of the present disclosure.

With reference to FIGS. 5, 6A and 6B, flowcharts 500, 600 and 650 illustrate example functions used by various embodiments of the present disclosure. Although specific function blocks ("blocks") are disclosed in flowcharts 500, 600 and 650, such steps are examples. That is, embodiments are well suited to performing various other blocks or variations of the blocks recited in flowcharts 500, 600 and 650. It is appreciated that the blocks in flowcharts 500, 600 and 650 may be performed in an order different than presented, and that not all of the blocks in flowcharts 500, 600 and 650 may be performed.

FIG. 5 is a flowchart 500 of a process for run-time protocol translation, during a simulation, according to an embodiment. The run-time protocol translation is divided into two stages: simulation initialization and simulation run-time. In step 552, during initialization of a SYSTEMC simulation, design configuration information describing the configuration of a target system (e.g., computer system, system on chip, etc) to be simulated is accessed. An example of a system is the one shown in FIG. 2. The system includes several components that communicate with different protocols and has been prepared by a system designer prior to the simulation. Design configuration information may include a connectivity map describing how components are connected to each other. Design configuration information may also include information describing the specific protocols used by those components.

In step 554, desired protocol specifications are identified based on the protocols specified in the design configuration information. For example, knowing that one component uses AHB and another component uses AXI, an AXI protocol specification and an AHB protocol specification can be identified from a database of protocol specifications. For example, the protocol specifications may be the protocol specifications shown in FIG. 4.

In step 556, RTB logic 310 is dynamically generated based on the desired protocol specifications. In one embodiment, generating RTB logic can involve the following steps. Based on the source and destination protocol specifications, portions of the state translation table 342 that can be used to translate between the source and destination protocol states are identified. The state translation table 342 can include information useful for translating between many different destination protocols and many different source protocols. Only a small portion of the state translation table 342 may be useful in configuring the RTB logic for operating with a specific destination protocol and a specific source protocol. These portions of the state translation table 342 are identified and then used to generate state decision logic of the RTB logic 310.

Additionally, portions of the attribute-callback table 340 that reference callbacks 352 that are useful for translation into the attributes of the source and destination protocols are identified and added to the RTB logic 310. In one embodiment, the final RTB 310 can be viewed as a local translation table for state mapping and references to the attribute mapping callbacks 352 that can be used to invoke the attribute mapping callbacks 352 on demand.

In step 558, RTB logic 310 is inserted into the system for components specified by the design configuration information that use different protocols. RTB logic 310 only needs to be inserted between two components when the components communicate using different protocols. It is not needed when two components communicate with the same protocol. In one embodiment, inserting the RTB logic 310 involves overriding the interface implementation of a TLM 2.0 API in the components, such as by modifying interface method calls of the TLM 2.0 API.

In step 560, during simulation run-time, the RTB logic 310 intercepts communication payloads generated by a source component that are formatted for a source protocol. The RTB logic 310 also accesses the communication payloads to perform translation of communication payloads into a destination protocol. Because the RTB logic is configured to behave in accordance with the information from the mapping registry 450, it may not need to access the mapping registry 450 anymore during simulation run-time. The translation can be performed on demand in response to a request from the destination component 220. The run-time translation can include mapping of states from the source protocol to the destination protocol. The run-time translation can also include mapping of attributes from the source protocol to the destination protocol. The run-time translation step 560 is further described by reference to FIGS. 5 and 6.

FIG. 6A shows a flowchart 600 of a process for protocol state mapping in accordance with one embodiment of the present disclosure. Flowchart 600 depicts a process for mapping of a protocol state of one protocol to another protocol state of another protocol and may be performed by the RTB logic 310. In one embodiment, state mapping may be coupled with attribute mapping (e.g., process 650) thereby allowing for seamless translation of any two protocols for the payload and the corresponding protocol state machines.

At block 601 an intercepted communication payload is received at the RTB logic 310. The communication payload may generated by a source component 202 that is sent to a destination component 220 and intercepted by the RTB logic 310 at run time. The communication payload is formatted for the protocol of the source component 202.

At block 602, a current protocol state for the destination protocol of the destination component 302 is accessed by the RTB logic 310. The protocol state for the destination protocol may be a protocol state queried from the destination component 302.

At block 604, whether a mapped state is found is determined by the RTB logic 310. If there is no mapping from the protocol state of the payload (e.g. of the source component 202) to a protocol state for the destination component 220, block 614 is performed. If a mapped state is found, block 606 is performed. In some embodiments, the current destination state may be used during step 604 to determine whether the state for the source protocol can be mapped to a state for the destination protocol.

At block 606, once a mapped state is found, the payload modified with the mapped state for the destination component, and the modified payload is forwarded to the destination component.

In one embodiment, after the destination component 202 receives the modified payload with the mapped state, it then makes a request for an attribute as shown in FIG. 6B.

At block 614, when a mapped state is not found, the next protocol state for the source protocol is injected into the payload and the payload is returned back to the source component. The next protocol state is determined by the RTB logic 310. Notably, the payload is not forwarded to the destination when a mapped state is not found. This is because the destination component 220 is not able to use the payload if no mapped state can be found. Thus, instead of forwarding the payload to the destination component 220, the protocol state of the source component 202 is advanced to the next state.

FIG. 6B shows a flowchart 650 of a process for attribute mapping during simulation run-time in accordance with one embodiment of the present disclosure. Flowchart 650 depicts a process for mapping of attributes from a source protocol to a destination protocol and may be performed in logic such as the RTB logic 310 or the callbacks 352. In one embodiment, the steps in flowchart 650 of FIG. 6B are performed after the steps of flowchart 600 of FIG. 6A.

At block 654, the RTB logic 310 receives a request from a destination component 220 to access an attribute. The attribute requested may be a request for a generic attribute or a protocol specific attribute that is specific to the destination protocol of the destination component 220.

At block 656, the RTB logic 310 determines whether the requested attribute is present in the payload. In one embodiment, the semantics of the source protocol are determined from the payload. Whether an attribute is present may be based on whether a requested attribute is common to the source protocol of the source component and the destination protocol of the destination component. For example, if the attribute is a generic attribute it may be common to both protocols, whereas protocol specific attributes may not be common to both protocols. If an attribute is present in the payload then block 664 is performed. If an attribute is not present in the payload then block 658 is performed.

At block 664, the RTB logic 310 accesses the attribute and returns the attribute to the destination component 220 if it is present in the payload. When a destination component 220 attempts to access a generic attribute and the attribute is present in the payload, the attribute is identified as common and the value of the attribute is returned to the destination component 220 that attempted to access it. For example, if the destination component 220 attempts to access a generic address attribute, the value of the address attribute is returned.

At block 658, the RTB logic 310 invokes an attribute mapping callback for a requested attribute if the requested attribute is not present in the payload. Requested attributes are typically not present in the payload when they are protocol specific attributes. In one embodiment, if a destination component 220 attempts to access an attribute that is not present in the payload, an attribute mapping callback 352 that is associated with the protocol specific attribute is invoked to map an attribute from the payload into a protocol specific attribute for the destination protocol of the destination component 220.

At block 660, the attribute mapping callback 352 maps the attribute in the payload from the source protocol of the source component 202 to the destination protocol of the destination component 220. The attribute mapping results in an attribute value for the requested attribute. It is noted that the attribute mappings may be performed in other ways and embodiments of the present disclosure are not limited to performing mapping using attribute mapping callbacks 352.

At block 662, the RTB logic 310 sends the mapped attribute value to the destination component 220 that requested the attribute, thereby returning the requested attribute. The destination component 220 may then request another attribute or perform internal logic operations using the attribute and generate a return payload. The return payload is processed by the RTB logic 310 in the same manner as that shown in FIGS. 6A and 6B, except that attributes and states will now be mapped from the destination protocol to the source protocol.

Figure 7:
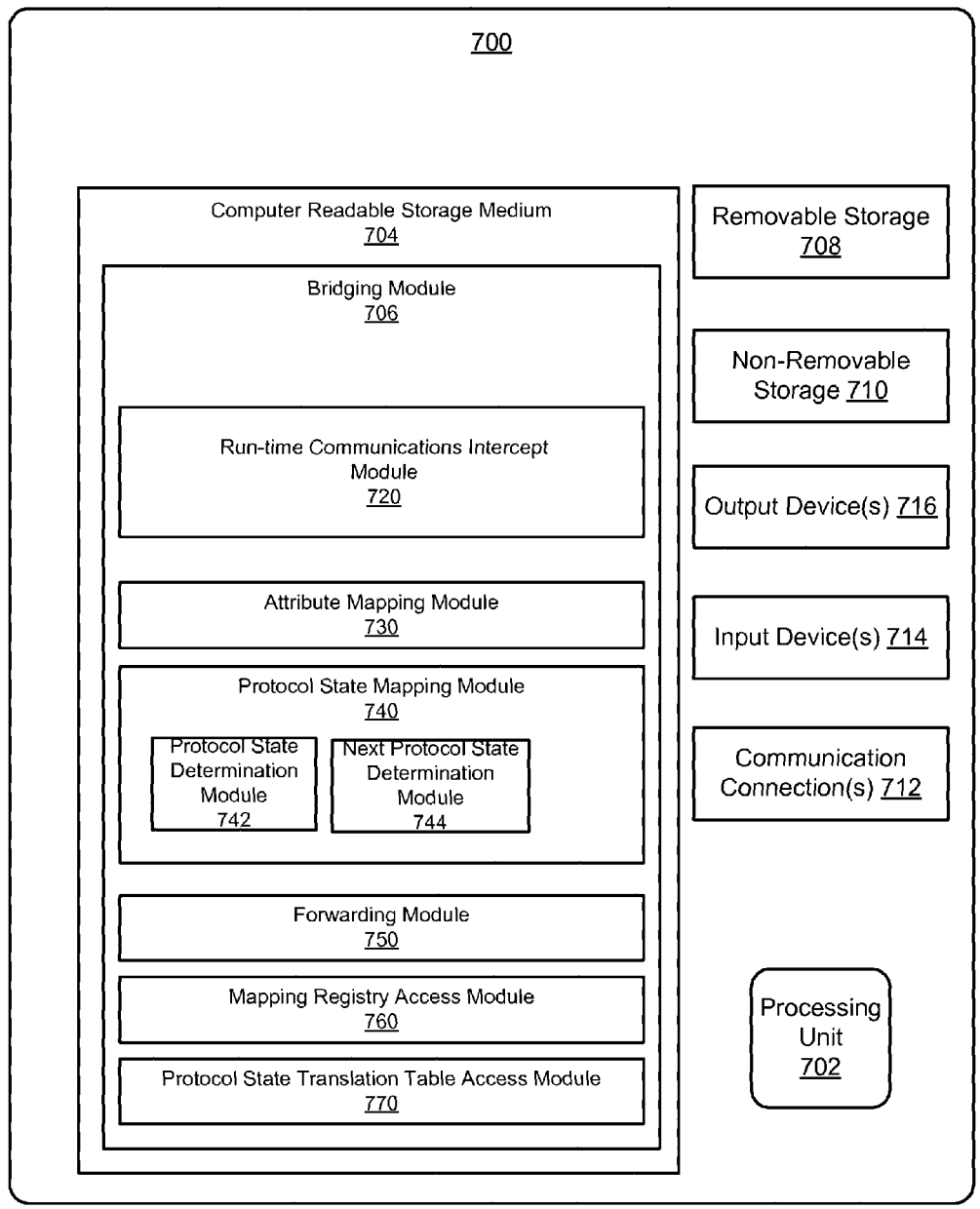
FIG. 7 shows a block diagram of exemplary computer system and corresponding modules, in accordance with one embodiment of the present disclosure.

FIG. 7 illustrates example components used by various embodiments of the present disclosure. Although specific components are disclosed in computing system environment 700, it should be appreciated that such components are examples. That is, embodiments of the present disclosure are well suited to having various other components or variations of the components recited in computing system environment 700. It is appreciated that the components in computing system environment 700 may operate with other components than those presented, and that not all of the components of system 700 may be required to achieve the goals of computing system environment 700.

FIG. 7 shows a block diagram of an exemplary computing system environment 700, in accordance with one embodiment of the present disclosure. With reference to FIG. 7, an exemplary system module for implementing embodiments includes a general purpose computing system environment, such as computing system environment 700. Computing system environment 700 may include, but is not limited to, servers, desktop computers, laptops, tablet PCs, mobile devices, and smartphones. In one embodiment, computing system environment 700 is computer system 100. In its most basic configuration, computing system environment 700 typically includes at least one processing unit 702 and non-transitory computer readable storage medium 704. Depending on the exact configuration and type of computing system environment, computer readable storage medium 704 may be volatile (such as RAM), non-volatile (such as ROM, flash memory, etc.) or some combination of the two. Portions of computer readable storage medium 704 includes processor executable instructions that when executed facilitate communication bridging (e.g., processes 500, 600, 650).

Additionally, computing system environment 700 may also have additional features/functionality. For example, computing system environment 700 may also include additional storage (removable and/or non-removable) including, but not limited to, magnetic or optical disks or tape. Such additional storage is illustrated in FIG. 7 by removable storage 708 and non-removable storage 710. Computer storage media includes volatile and nonvolatile, removable and non-removable media implemented in any method or technology for storage of information such as computer readable instructions, data structures, program modules or other data. Computer readable medium 704, removable storage 708 and nonremovable storage 710 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing system environment 700. Any such computer storage media may be part of computing system environment 700.

Computing system environment 700 may also contain communications connection(s) 712 that allow it to communicate with other devices. Communications connection(s) 712 is an example of communication media. Communication media typically embodies computer readable instructions, data structures, program modules or other data in a modulated data signal such as a carrier wave or other transport mechanism and includes any information delivery media. The term computer readable media as used herein includes both storage media and communication media.

Communications connection(s) 712 may allow computing system environment 700 to communication over various networks types including, but not limited to, fibre channel, small computer system interface (SCSI), Bluetooth, Ethernet, Wi-fi, Infrared Data Association (IrDA), Local area networks (LAN), Wireless Local area networks (WLAN), wide area networks (WAN) such as the internet, serial, and universal serial bus (USB). It is appreciated the various network types that communication connection(s) 712 connect to may run a plurality of network protocols including, but not limited to, transmission control protocol (TCP), internet protocol (IP), real-time transport protocol (RTP), real-time transport control protocol (RTCP), file transfer protocol (FTP), and hypertext transfer protocol (HTTP).

Computing system environment 700 may also have input device(s) 714 such as a keyboard, mouse, pen, voice input device, touch input device, remote control, etc. Output device(s) 716 such as a display, speakers, etc. may also be included. All these devices are well known in the art and are not discussed at length.

In one embodiment, computer readable storage medium 704 includes bridging module 706. Bridging module 706 includes communication intercept module 720, attribute mapping module 730, protocol state mapping module 740, forwarding module 750, mapping registry access module 760, and protocol state translation table access module 770.

Run-time communication intercept module 720 is operable to intercept communications between a first component and a second component where the first component is operable to communicate based on a first protocol and the second component is operable to communicate based on a second protocol. Run-time communication intercept module 720 is further operable to intercept communications between the first component and the second component at run time. In one exemplary embodiment, run-time communication intercept module 720 is operable to intercept communication between a first component and second component which are part of a system level modeling simulation, such as a SYSTEMC simulation. In one embodiment, run-time communication intercept module 720 also intercepts a return communication from a component (e.g., a return payload or communication from the second component).

Attribute mapping module 730 is operable to map a first attribute of a payload of the first protocol to a second attribute of the second protocol, as described herein. On a return path, attribute mapping module 730 is further operable to map a third attribute of the return communication (e.g., return payload) to a fourth attribute of the first protocol, as described herein.

A protocol state mapping module 740 is operable to map a first state of the first protocol to a second protocol state of the second protocol. In one embodiment, protocol state mapping module 740 includes protocol state determination module 742 which is operable to determine a protocol state for a destination component. Protocol state mapping module 740 further includes next protocol state determination module 744 which is operable to determine a next protocol state of a component. Run-time intercept module 720, attribute mapping module 730, and protocol state mapping module 740 may together include the functionality of the run-time bridging logic 310.

In one exemplary embodiment, protocol state mapping module 740 is operable to inject a next protocol state of the second protocol if the first protocol state of the first protocol does not correspond to the second protocol state of the second protocol. Protocol state mapping module 740 is further operable to map a third protocol state of a return communication to a fourth protocol state of the first protocol, as described herein.

Forwarding module 750 is operable to forward (i.e. send) payloads, values of mapped attributes, and values of mapped states to component. Mapping registry access module 760 is operable to provide access to attribute callback table 340 of the mapping registry 450 (e.g., for use by attribute mapping module 730 and protocol state mapping module 740). Protocol state translation table access module 770 is operable to provide access to a protocol state translation table, as described herein (e.g., for use by protocol state mapping module 740).

The foregoing descriptions of specific embodiments of the present disclosure have been presented for purposes of illustration and description. They are not intended to be exhaustive or to limit the disclosure to the precise forms disclosed, and many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the claims appended hereto and their equivalents.

What is claimed is:

1. A method of protocol bridging comprising:
    accessing design configuration information describing a first representation of a first hardware block within an integrated circuit (IC) die that uses a first communication protocol and a second representation of a second hardware block within the IC die that uses a second communication protocol, wherein the first representation of the first hardware block and the second representation of the second hardware block communicate via a transaction level modeling application programming interface (API);
    generating run-time bridging logic based on at least one of: the design configuration information, and one or more callbacks that translate one or more attributes between the first communication protocol and the second communication protocol; and
    inserting, by modifying one or more interface method calls of the API, the run-time bridging logic between the first representation of the first hardware block that uses the first communication protocol and the second representation of the second hardware block that uses the second communication protocol, the run-time bridging logic configured to bridge the first communication protocol of the first representation of the first hardware block and the second communication protocol of the second representation of the second hardware block.

2. The method of claim 1, wherein generating the run-time bridging logic is further based on protocol specifications describing the first communication protocol and the second communication protocol.

3. The method of claim 1, wherein generating the run-time bridging logic is further based on a state translation table that includes mappings of states between different communication protocols.

4. The method of claim 1, further comprising:
    intercepting, by the run-time bridging logic, at least one communication payload formatted for the first communication protocol that is sent from the first representation of the first hardware block to the second representation of the second hardware block.

5. The method of claim 1, further comprising:
    accessing at least one communication payload formatted for the first communication protocol sent from the first representation of the first hardware block to the second representation of the second hardware block; and
    translating, by the run-time bridging logic, the at least one communication payload from the first communication protocol to the second communication protocol.

6. The method of claim 5, wherein translating the at least one communication payload comprises:
    receiving a request from the second representation of the second hardware block for a protocol specific attribute that is specific to the second communication protocol; and
    invoking, with the run-time bridging logic, an attribute mapping callback of the one or more callbacks that includes logic to map information in the payload to the protocol specific attribute that is specific to the second communication protocol.

7. The method of claim 6, further comprising:
    sending the protocol specific attribute to the second representation of the second hardware block.

8. The method of claim 7, wherein the at least one communication payload includes a first protocol state of the first communication protocol, and translating the at least one communication payload comprises:
    mapping, with the run-time bridging logic, the first protocol state of the first communication protocol to a second protocol state of the second communication protocol.

9. The method of claim 1, wherein the run-time bridging logic is generated based on the design configuration information that comprises a connectivity map of the first representation of the first hardware block and the second representation of the second hardware block.

10. The method of claim 1, wherein the run-time bridging logic is generated by adding to the run-time bridging logic one or more references that invoke the one or more callbacks on demand.

11. The method of claim 10, further comprising:
receiving a request to perform the translation of the one or more attributes between the first and second communication protocols; and
using, in response to the request, the one or more references in the run-time bridging logic to invoke the one or more callbacks that translate the one or more attributes between the first and second communication protocols.

12. The method of claim 1, wherein the first representation of the first hardware block is a first simulation representation of the first hardware block and the second representation of the second hardware block is a second simulation representation of the second hardware block, and wherein the run-time bridging logic is inserted at initialization of a system level modeling simulation (SLMS).

13. A non-transitory computer readable medium storing processor executable instructions for protocol bridging, the instructions comprising instructions for:
accessing design configuration information describing a first representation of a first hardware block within an integrated circuit (IC) die that uses a first communication protocol and a second representation of a second hardware block within the IC die that uses a second communication protocol, wherein the first representation of the first hardware block and the second representation of the second hardware block communicate via a transaction level modeling application programming interface (API);
generating run-time bridging logic based on at least one of: the design configuration information, and one or more callbacks that translate one or more attributes between the first communication protocol and the second communication protocol; and
inserting, by modifying one or more interface method calls of the API, the run-time bridging logic between the first representation of the first hardware block that uses the first communication protocol and the second representation of the second hardware block that uses the second communication protocol, the run-time bridging logic configured to bridge the first communication protocol of the first representation of the first hardware block and the second communication protocol of the second representation of the second hardware block.

14. The computer readable medium of claim 13, the instructions further comprising instructions for:
generating the run-time bridging logic further based on protocol specifications describing the first communication protocol and the second communication protocol.

15. The computer readable medium of claim 13, the instructions further comprising instructions for:
generating the run-time bridging logic further based on a state translation table that includes mappings of states between different communication protocols.

16. The computer readable medium of claim 13, the instructions further comprising instructions for:
intercepting, by the run-time bridging logic, at least one communication payload formatted for the first communication protocol that is sent from the first representation of the first hardware block to the second representation of the second hardware block.

17. The computer readable medium of claim 13, the instructions further comprising instructions for:
accessing at least one communication payload formatted for the first communication protocol sent from the first representation of the first hardware block to the second representation of the second hardware block; and
translating, by the run-time bridging logic, the at least one communication payload from the first communication protocol to the second communication protocol.

18. The computer readable medium of claim 17, the instructions further comprising instructions for:
receiving a request from the second representation of the second hardware block for a protocol specific attribute that is specific to the second communication protocol; and
invoking, with the run-time bridging logic, an attribute mapping callback of the one or more callbacks that includes logic to map information in the payload to the protocol specific attribute that is specific to the second communication protocol.

19. The computer readable medium of claim 18, the instructions further comprising instructions for:
sending the protocol specific attribute to the second representation of the second hardware block.

20. The computer readable medium of claim 19, the instructions further comprising instructions for:
mapping, with the run-time bridging logic, the first protocol state of the first communication protocol to a second protocol state of the second communication protocol.

21. The computer readable medium of claim 13, the instructions further comprising instructions for:
generating the run-time bridging logic based on the design configuration information that comprises a connectivity map of the first representation of the first hardware block and the second representation of the second hardware block.

22. The computer readable medium of claim 13, the instructions further comprising instructions for:
generating the run-time bridging logic by adding to the run-time bridging logic one or more references that invoke the one or more callbacks on demand.

23. The computer readable medium of claim 22, the instructions further comprising instructions for:
receiving a request to perform the translation of the one or more attributes between the first and second communication protocols; and
using, in response to the request, the one or more references in the run-time bridging logic to invoke the one or more callbacks that translate the one or more attributes between the first and second communication protocols.

* * * * *